US009754830B2

(12) United States Patent
Fukumori et al.

(10) Patent No.: US 9,754,830 B2
(45) Date of Patent: Sep. 5, 2017

(54) WIRING SUBSTRATE, METHOD FOR MANUFACTURING WIRING SUBSTRATE, ELECTRONIC DEVICE AND METHOD FOR MANUFACTURING ELECTRONIC DEVICE

(71) Applicant: FUJITSU LIMITED, Kawasaki-shi, Kanagawa (JP)

(72) Inventors: Taiga Fukumori, Isehara (JP); Daisuke Mizutani, Sagamihara (JP); Mamoru Kurashina, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/132,790

(22) Filed: Apr. 19, 2016

(65) Prior Publication Data
US 2016/0233128 A1    Aug. 11, 2016

Related U.S. Application Data

(62) Division of application No. 13/920,315, filed on Jun. 18, 2013, now abandoned.

(30) Foreign Application Priority Data

Jul. 20, 2012   (JP) .................................. 2012-161495

(51) Int. Cl.
*H01L 21/4763*   (2006.01)
*H01L 21/768*   (2006.01)
(Continued)

(52) U.S. Cl.
CPC .. *H01L 21/76898* (2013.01); *H01L 21/76877* (2013.01); *H01L 23/481* (2013.01);
(Continued)

(58) Field of Classification Search
CPC ... H01L 2224/0401; H01L 2224/05008; H01L 2224/13021; H01L 2224/13022;
(Continued)

(56) References Cited

U.S. PATENT DOCUMENTS

| 5,260,518 A | 11/1993 | Tanaka et al. |
| 5,889,655 A | 3/1999 | Barrow |

(Continued)

FOREIGN PATENT DOCUMENTS

| JP | H7-273146 A | 10/1995 |
| JP | H8-78797 A | 3/1996 |

(Continued)

OTHER PUBLICATIONS

Office Action of corresponding Japanese Patent Application No. 2012-161495 dated Nov. 24, 2015, with partial translation.

(Continued)

*Primary Examiner* — Matthew E Warren
(74) *Attorney, Agent, or Firm* — Kratz, Quintos & Hanson, LLP

(57) ABSTRACT

A wiring substrate includes: a substrate; an insulator formed in the substrate and having a through hole; an electrode formed in the substrate and provided within the through hole; and a conductor bonded to the electrode and provided within the through hole, wherein the through hole has a shape that is widened toward a direction away from the substrate, and the conductor is configured to cover the entire top surface of the electrode and has a shape that is widened toward the direction away from the substrate.

8 Claims, 22 Drawing Sheets

(51) Int. Cl.
*H01L 23/48* (2006.01)
*H01L 23/66* (2006.01)
*H01L 23/00* (2006.01)
*H01L 23/498* (2006.01)

(52) U.S. Cl.
CPC ........ *H01L 23/49811* (2013.01); *H01L 23/66* (2013.01); *H01L 24/05* (2013.01); *H01L 24/13* (2013.01); *H01L 23/49822* (2013.01); *H01L 23/49827* (2013.01); *H01L 2223/6616* (2013.01); *H01L 2224/0401* (2013.01); *H01L 2224/05647* (2013.01); *H01L 2224/13611* (2013.01); *H01L 2224/13639* (2013.01); *H01L 2224/16* (2013.01)

(58) Field of Classification Search
CPC . H01L 2224/13023; H01L 2224/13024; H01L 2224/13025; H01L 23/522; H01L 23/5226; H01L 23/49186; H01L 24/81
USPC ................ 257/737–739, 774, 775, 779, 780; 438/613, 637–640, 666–668
See application file for complete search history.

(56) References Cited

U.S. PATENT DOCUMENTS

| | | | |
|---|---|---|---|
| 6,109,507 A | 8/2000 | Yagi et al. | |
| 6,708,868 B1 | 3/2004 | Pilat | |
| 6,864,577 B2 | 3/2005 | Clatanoff et al. | |
| 6,888,255 B2* | 5/2005 | Murtuza | H01L 23/49811 |
| | | | 228/180.22 |
| 7,825,513 B2 | 11/2010 | Osumi | |
| 8,350,384 B2 | 1/2013 | Pendse | |
| 2001/0015495 A1 | 8/2001 | Brofman et al. | |
| 2001/0045611 A1 | 11/2001 | Clatanoff et al. | |
| 2002/0140090 A1 | 10/2002 | Maetani | |
| 2003/0162379 A1* | 8/2003 | Tong | H01L 24/11 |
| | | | 438/613 |
| 2005/0285266 A1* | 12/2005 | Reiss | H01L 23/49816 |
| | | | 257/738 |
| 2006/0237855 A1 | 10/2006 | Kroehnert et al. | |
| 2009/0246960 A1 | 10/2009 | Kim | |
| 2012/0068335 A1 | 3/2012 | Song | |

FOREIGN PATENT DOCUMENTS

| | | |
|---|---|---|
| JP | H8-236655 A | 9/1996 |
| JP | H11-145176 A | 5/1999 |
| JP | 2000-223819 A | 8/2000 |
| JP | 2000-223824 A | 8/2000 |
| JP | 2000-236144 A | 8/2000 |
| JP | 2002-299502 A1 | 10/2002 |
| JP | 2002-543603 A1 | 12/2002 |
| JP | 2004-319928 A | 11/2004 |
| JP | 2006-339563 A1 | 12/2006 |
| JP | 2009-55019 A1 | 3/2009 |
| JP | 2009-111336 A | 5/2009 |
| JP | 2009-239244 A1 | 10/2009 |
| JP | 2010-219463 A1 | 9/2010 |
| JP | 2012-74595 A | 4/2012 |
| WO | 00/13232 A1 | 3/2000 |

OTHER PUBLICATIONS

The extended European search report of corresponding European Patent Application No. 13173004.6 dated Oct. 21, 2016.

* cited by examiner

WIRING SUBSTRATE, METHOD FOR MANUFACTURING WIRING SUBSTRATE, ELECTRONIC DEVICE AND METHOD FOR MANUFACTURING ELECTRONIC DEVICE

CROSS-REFERENCE TO RELATED APPLICATION

This application is based upon and claims the benefit of priority from the prior Japanese Patent Application No. 2012-161495 filed on Jul. 20, 2012, the entire contents of which are incorporated herein by reference.

FIELD

The embodiments discussed herein are related to a wiring substrate, a method for manufacturing the wiring substrate, an electronic device, and a method for manufacturing the electronic device.

BACKGROUND

In a wiring substrate such as, for example, a package substrate and a system board, a signal reflection may be suppressed to improve the signal quality by keeping the ratio of the inductance and capacitance constant (i.e., by performing an impedance matching) in a path through which the electrical signal passes. As a result, an impedance matching technology has been developed in which an impedance matching is performed in wirings or vias within a substrate. For example, a design method has been developed in wiring micro-strip lines, in which a conductor distance between signal-ground or the width of a signal wiring is adjusted according to the permittivity of an insulation material such that the impedance approaches a desired value.

When a portion of the signal path has different characteristic impedance, a signal reflection occurs at the boundary surface of the portion where the characteristic impedance is different. When a high frequency signal is applied, it has become a recent problem that a signal reflection occurs in a bonding portion between wiring substrates due to the change of the ratio of the inductance and capacitance.

For example, as illustrated in FIG. 19, when a semiconductor package 61 is mounted on a system board 71, an electrode pad 62 of the semiconductor package 61 and an electrode pad 72 of the system board 71 are bonded each other with a solder ball 81. Since the electrode pad 62 of the semiconductor package 61 is far bigger than a conductor pattern (wirings and vias) 63 of the semiconductor package 61, an impedance mismatch occurs to increase the signal reflection when the high frequency signal is used. As illustrated in FIG. 20, since the solder ball 81 is large even if the size of the electrode pad 62 of the semiconductor package 61 becomes small, an impedance mismatch occurs increasing the signal reflection at the high frequency range as in the case where the electrode pad 62 of the semiconductor package 61 is large.

When the impedance matching is performed by reducing the size of the electrode pad 62 of the semiconductor package 61 and the solder ball 81, the height of the solder ball 81 is lowered by making the solder ball 81 small. When the height of the solder ball 81 is lowered, the solder ball 81 may not be bonded to the semiconductor package 61 or the system board 71 due to the deformation such as, for example, the flexure or wrinkling of the semiconductor package 61 and the system board 71, as illustrated in FIG. 21. The semiconductor package 61 and the system board 71 suffer from an expansion and a shrinkage caused by the temperature change. As a result, in order to maintain the bonding between the semiconductor package 61 and the system board 71, it is not advisable to reduce the size of the solder ball 81.

The following is reference documents:
[Document 1] Japanese Laid-Open Patent Publication No. H08-236655,
[Document 2] Japanese Laid-Open Patent Publication No. 2002-299502,
[Document 3] Japanese Laid-Open Patent Publication No. 2006-339563,
[Document 4] Japanese Laid-Open Patent Publication No. 2009-55019,
[Document 5] Japanese Laid-Open Patent Publication No. 2010-219463,
[Document 6] Japanese Laid-Open Patent Publication No. H08-78797,
[Document 7] Japanese National Publication of International Patent Application No. 2002-543603,
[Document 8] Japanese Laid-Open Patent Publication No. H07-273146, and
[Document 9] Japanese Laid-Open Patent Publication No. 2000-223819.

SUMMARY

According to an aspect of the embodiments, a wiring substrate includes: a substrate; an insulator formed in the substrate and having a through hole; an electrode formed in the substrate and provided within the through hole; and a conductor bonded to the electrode and provided within the through hole. In particular, the through hole has a shape that is widened toward a direction away from the substrate, and the conductor is configured to cover the entire top surface of the electrode and has a shape that is widened toward the direction away from the substrate.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Hereinafter, exemplary embodiments will be described with reference to the accompanying drawings. The configuration of the following embodiments are an illustrative example, the exemplary embodiments are not limited to the configurations of the embodiments.

First Embodiment

Figure 1:
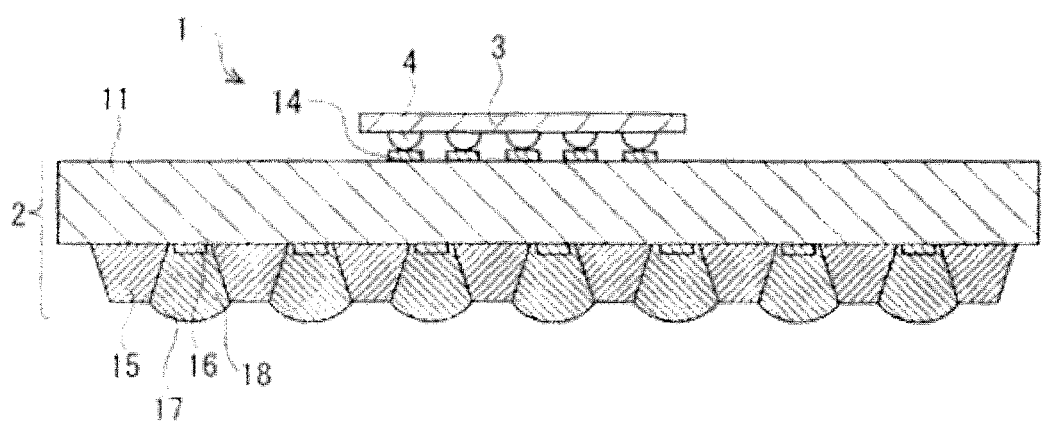
FIG. 1 is a cross-sectional view of a semiconductor package according to a first embodiment of the present disclosure.
Figure 2:
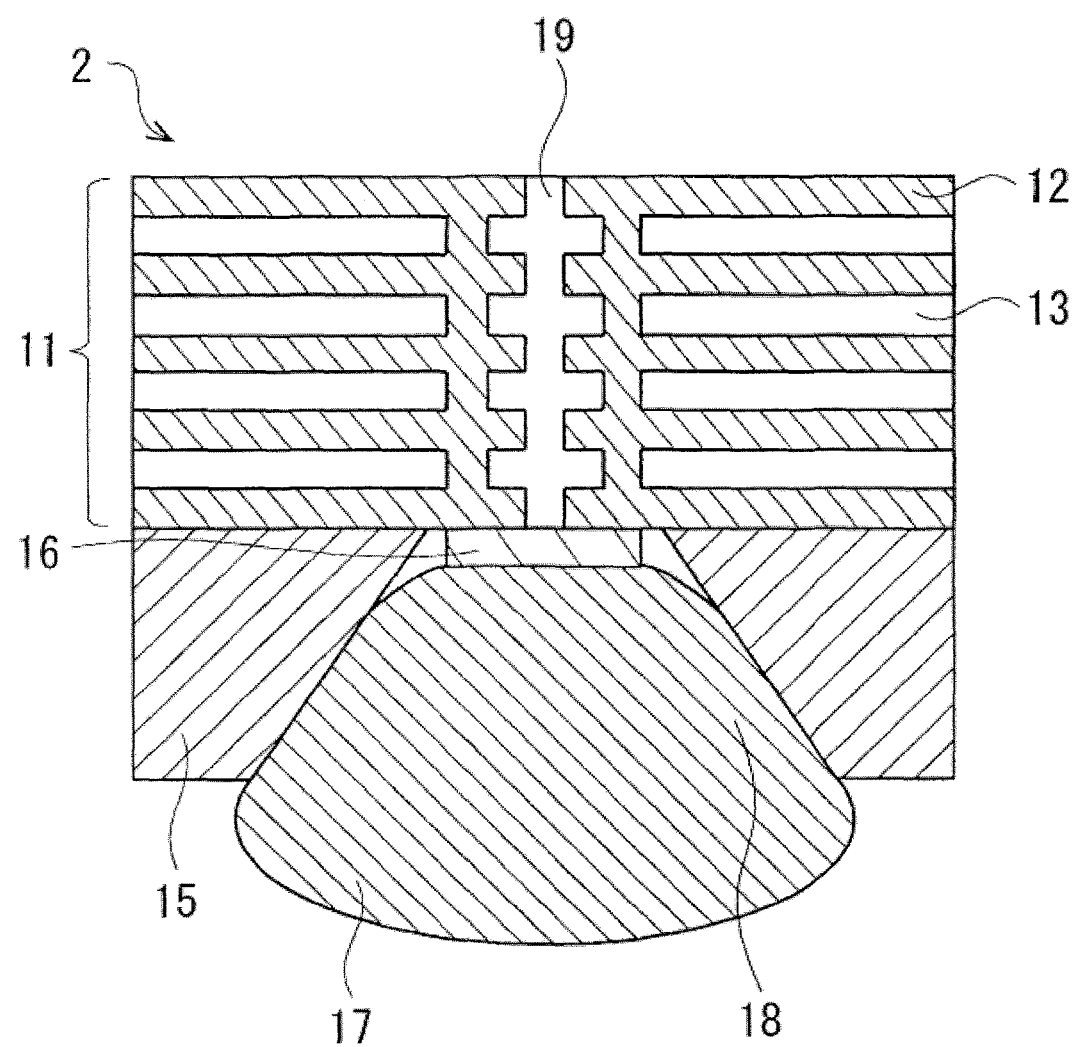
FIG. 2 is a partially enlarged cross-sectional view of a package substrate according to the first embodiment.

A first embodiment will be described. Referring to FIG. 1, a semiconductor package (a semiconductor device) 1 includes a package substrate (a wiring substrate) 2 and a semiconductor chip (a semiconductor element) 3. The package substrate 2 is an illustrative example of a first wiring substrate. FIG. 1 is a cross-sectional view of the semiconductor package 1 according to the first embodiment. FIG. 2 is a partially enlarged cross-sectional view of the package substrate 2 according to the first embodiment.

The package substrate 2 includes a support substrate 11 in which insulating layers 12 and wiring layers 13 are stacked, electrode pads 14, an insulation member 15, electrode pads 16, and conductive members 17. The support substrate 11 is an illustrative example of a substrate. The semiconductor chip 3 is mounted on the top surface (an element mounting surface) of the support substrate 11. The package substrate 2 and the semiconductor chip 3 are electrically connected to each other via the electrode pads 14 formed on the top surface of the support substrate 11 and bumps 4 formed on the electrode pads 14. The electrode pads 14 are formed of, for example, a copper (Cu). The bumps 4 are formed of, for example, a tin-silver (SnAg) solder. Further, a filling resin such as, for example, an underfill material may be provided between the package substrate 2 and the semiconductor chip 3 to reinforce the connection between the package substrate 2 and the semiconductor chip 3.

The insulation member 15, the electrode pads 16 and the conductive members 17 are formed on the bottom surface (a surface opposite to the element mounting surface) of the support substrate 11. The insulation member 15 is an illustrative example of an insulation part. The electrode pad 16 is an illustrative example of an electrode. The conductive member 17 is an illustrative example of a conductive part. The insulation member 15 is formed of a material such as, for example, mold resin, liquid crystal polymer, or thermoplastic polyimide. The mold resin is, for example, epoxy resin. The thickness of the insulation member 15 is, for example, about a few hundred μm.

The insulation member 15 has a plurality of through holes 18 which transmit through the insulation member 15. Each of the through holes 18 of the insulation member 15 is configured to be widened gradually toward the direction away from the support substrate 11.

Referring to FIG. 2, the first (one side) opening of the through hole 18 of the insulation member 15 is provided on the bottom surface of the insulation member 15, and the second (the other side) opening of the through hole 18 of the insulation member 15 is provided on the top surface of the insulation member 15. The bottom surface of the insulation member 15 is in contact with the bottom surface of the support substrate 11. Accordingly, the first opening of the through hole 18 of the insulation member 15 is closed by the support substrate 11.

The horizontal cross-section of the through hole 18 of the insulation member 15 may be a circular shape, and the through hole 18 of the insulation member 15 may have a truncated cone shape in which the diameters of circular shapes are continuously increased from the first opening toward the second opening of the through hole 18 of the insulation member 15. The diameter of the first opening of the through hole 18 of the insulation member 15 is, for example, about 0.2 mm or more and 0.3 mm or less. The diameter of the second opening of the through hole 18 of the insulation member 15 is, for example, about 0.6 mm or more and 1.0 mm or less.

Alternatively, the horizontal cross-section of the through hole 18 of the insulation member 15 may be a rectangular shape, and the through hole 18 of the insulation member 15 may have a truncated pyramid shape in which the widths of the sides of the rectangular shapes are continuously increased from the first opening toward the second opening of the through hole 18 of the insulation member 15. The widths of the sides of the first opening of the through hole 18 of the insulation member 15 are, for example, about 0.2 mm or more and 0.3 mm or less. The widths of the sides of the second opening of the through hole 18 of the insulation member 15 is, for example, about 0.6 mm or more and 1.0 mm or less.

Referring back to FIG. 1, the electrode pad 16 is formed of, for example, copper (Cu). The electrode pad 16 has a cylindrical shape or a cubic shape. The electrode pad 14 formed on the top surface of the support substrate 11 and the electrode pad 16 formed on the bottom surface of the support substrate 11 are electrically connected to each other via a conductor pattern (vias and wirings) 19 provided within the support substrate 11. The size of each electrode pad 16 may be the same as that of a land (not illustrated) formed on the conductor pattern.

The conductive member 17 is formed of, for example, a tin-silver (SnAg) solder. The conductive member 17 is provided within the through hole 18 of the insulation member 15, and bonded to the electrode pad 16. The conductive member 17 covers the entire top surface of the electrode pad 16.

No conductor may be formed between adjacent electrode pads 16 formed on the bottom surface of the support substrate 11. As a result, the short between the conductive member 17 and a conductor other than the electrode pad 16 may be suppressed.

Referring to FIG. 2, the conductive member 17 is made to have a shape that is widened gradually toward the direction away from the support substrate 11. The first end (one side) of the conductive member 17 is bonded to the electrode pad 16, and the second end (the other side) of the conductive member 17 protrudes from the second opening of the through hole 18 of the insulation member 15.

The horizontal cross-section of the conductive member 17 may be a circular shape, and the conductive member 17 may be in a truncated cone shape in which the diameters of circular shapes are continuously increased from the first end toward the second end of the conductive member 17. The horizontal cross-section of the conductive member 17 may be a rectangular shape, and the conductive member 17 may be in a truncated pyramid shape in which the widths of the sides of rectangular shapes are continuously increased from the first end toward the second end of the conductive member 17.

Figure 3A:
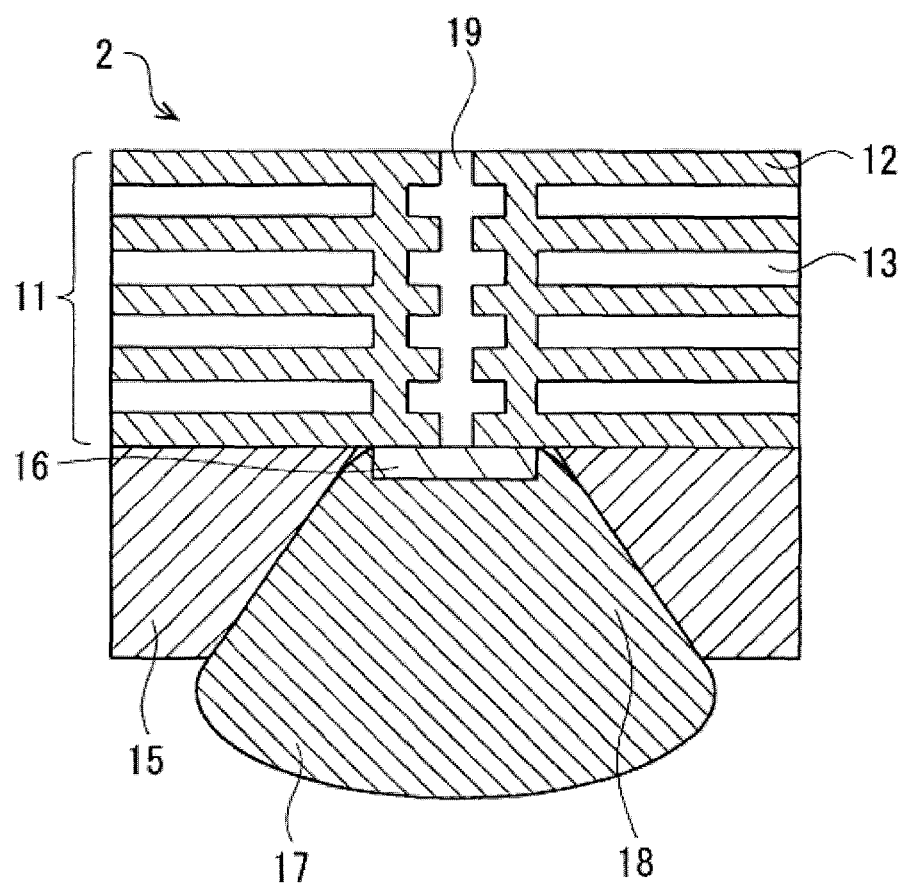
FIG. 3A is a partially enlarged cross-sectional view of the package substrate according to the first embodiment.

As illustrated in FIG. 3A, the conductive member 17 may cover the entire top surface and the entire side surface of the electrode pad 16. FIG. 3A is a partially enlarged cross-sectional view of the package substrate 2 according to the first embodiment. The entire top surface and the entire side surface of the electrode pad 16 are covered by the conductive member 17, and thus, the bonding area between the electrode pad 16 and the conductive member 17 is increased improving the bonding strength between the electrode pad 16 and the conductive member 17. Further, the conductive member 17 may cover the entire top surface and a part of the side surface of the electrode pad 16. The entire top surface and the part of the side surface of the electrode pad 16 are covered by the conductive member 17, and thus, the bonding area between the electrode pad 16 and the conductive member 17 is increased improving the bonding strength between the electrode pad 16 and the conductive member 17. By increasing the size of the first opening of the through hole 18 of the insulation member 15 to be larger than that of the electrode pad 16, the side surface of the electrode pad 16 may be easily covered by the conductive member 17.

Figure 3B:
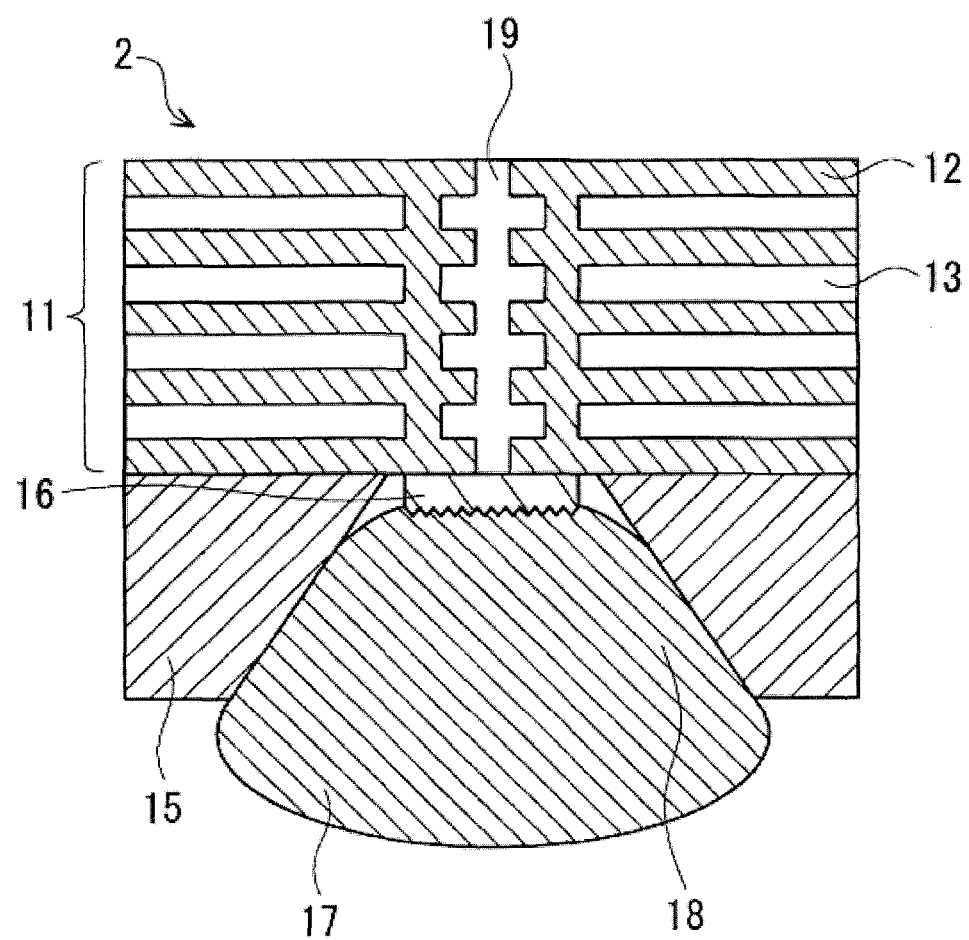
FIG. 3B is a partially enlarged cross-sectional view of the package substrate according to the first embodiment.

As illustrated in FIG. 3B, an unevenness may be provided on the top surface of the electrode pad 16. FIG. 3B is a partially enlarged cross-sectional view of the package substrate 2 according to the first embodiment. For example, a micro-etching processing such as a CZ processing or a sand blast processing may be used to provide the unevenness on the top surface of the electrode pad 16. A CZ8100 or a CZ8101, manufactured by MEC COMPANY LTD., may be used in the CZ processing. The unevenness may be provided on the top surface and the side surface of the electrode pad 16. In the electrode pad 16, the unevenness may be provided on the bonding surface with the conductive member 17. When the unevenness is provided on the bonding surface with the conductive member 17 of the electrode pad 16, the bonding area between the electrode pad 16 and the conductive member 17 is increased and as a result, the bonding strength between the electrode pad 16 and the conductive member 17 is improved.

Figure 4:
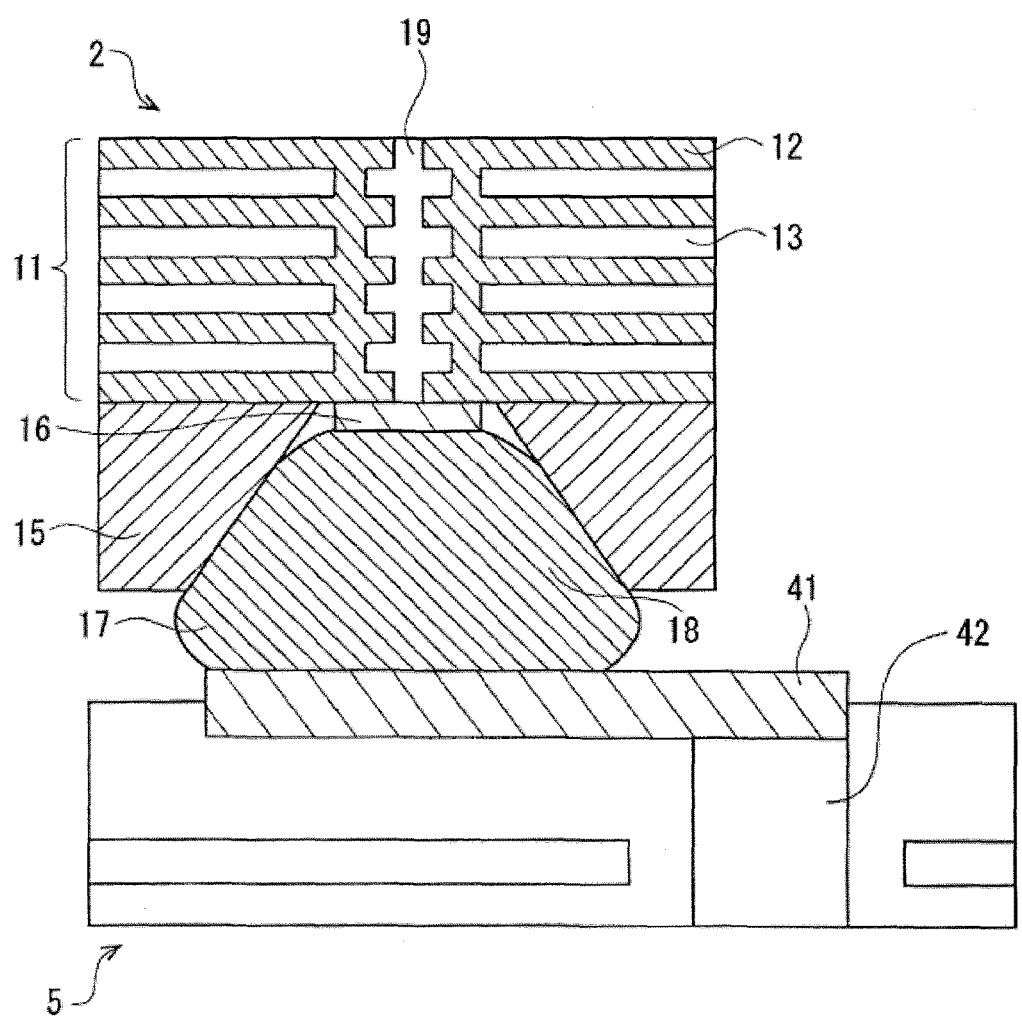
FIG. 4 is a partially enlarged cross-sectional view of an electronic device including a system board and the semiconductor package according to the first embodiment.

FIG. 4 is a partially enlarged cross-sectional view of an electronic device having a system board (a wiring substrate) 5 and the semiconductor package 1 according to the first embodiment. The semiconductor package 1 (the package substrate 2) is mounted on the top surface of the system board 5. The system board 5 is an illustrative example of a second wiring substrate. The conductive member 17 is bonded to an electrode pad 41 of the system board 5. The electrode pad 41 is an illustrative example of an electrode. The electrode pad 16 of the package substrate 2 is smaller than the electrode pad 41 of the system board 5. The surface area of the conductive member 17 in the bonding surface between the conductive member 17 and the electrode pad 16 of the package substrate 2 is smaller than the surface area of the conductive member 17 in the bonding surface of the conductive member 17 and the electrode pad 41 of the system board 5. The electrode pad 41 of the system board 5 is electrically connected to a conductor pattern (wirings and vias) 42 of the system board 5. The semiconductor package 1 (the package substrate 2) and the system board 5 are electrically connected to each other via the electrode pad 16 and the conductive member 17 of the package substrate 2 and the electrode pad 41 of the system board 5.

Figure 5:
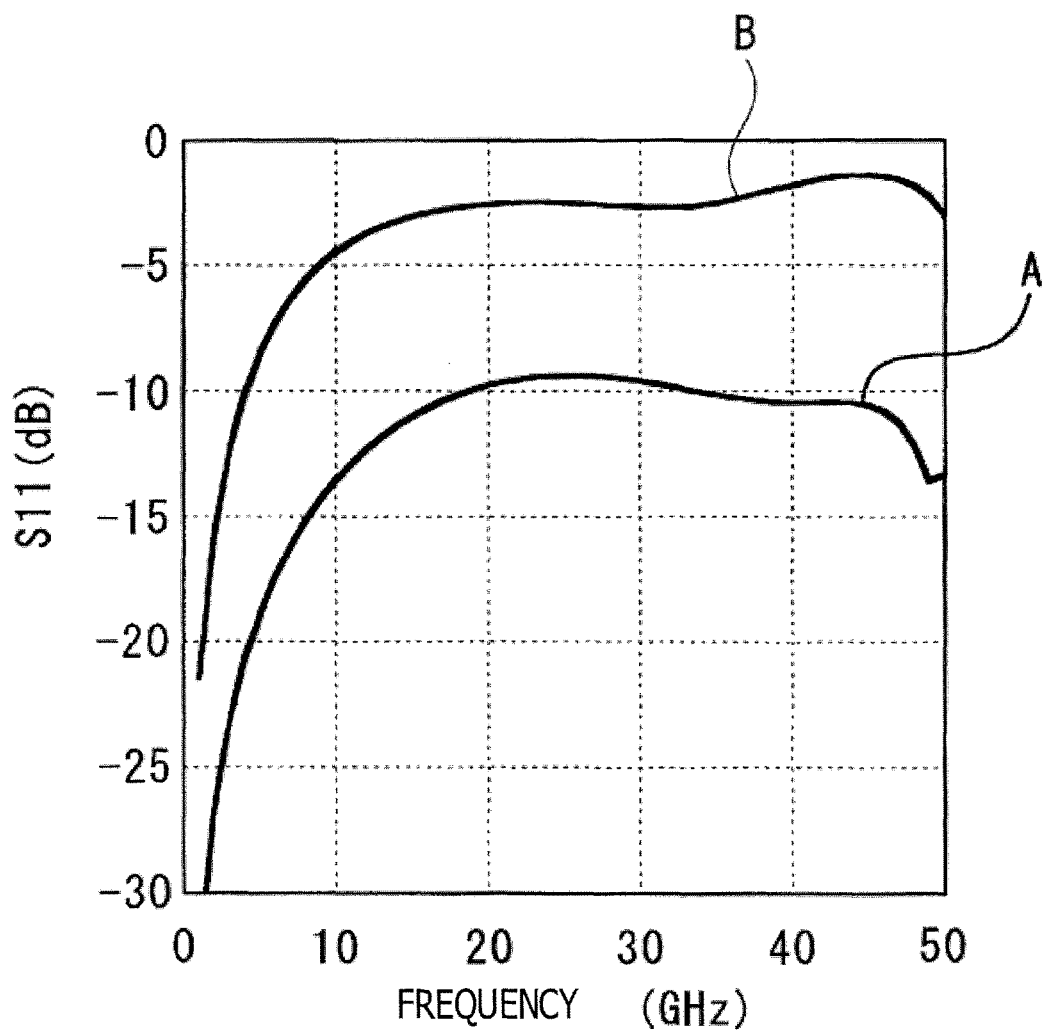
FIG. 5 is a graph illustrating a transfer characteristic of a conductive member of the package substrate according to the first embodiment and a transfer characteristic of a conductive member of a package substrate according to a comparative example.
Figure 6:
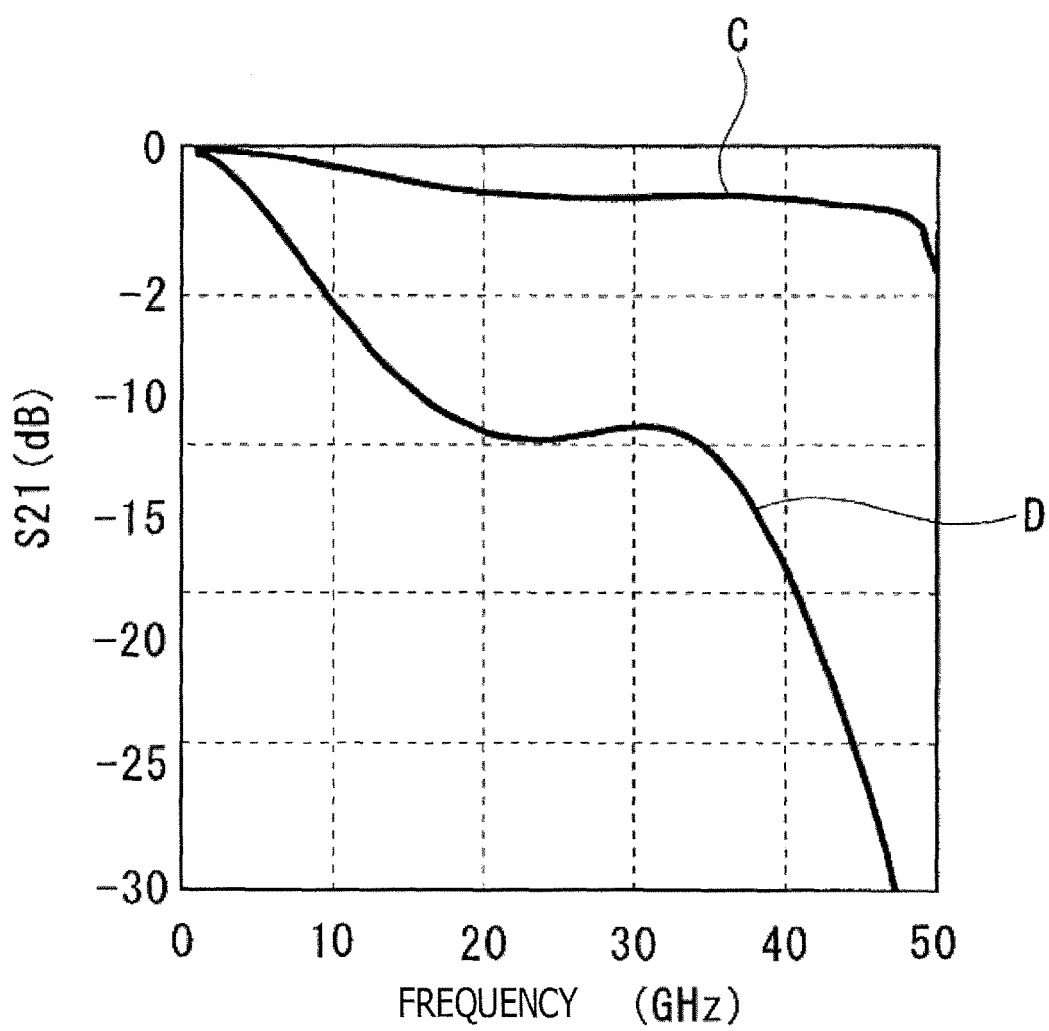
FIG. 6 is a graph illustrating a transfer characteristic of the conductive member of the package substrate according to the first embodiment and a transfer characteristic of the conductive member of the package substrate according to the comparative example.
Figure 7:
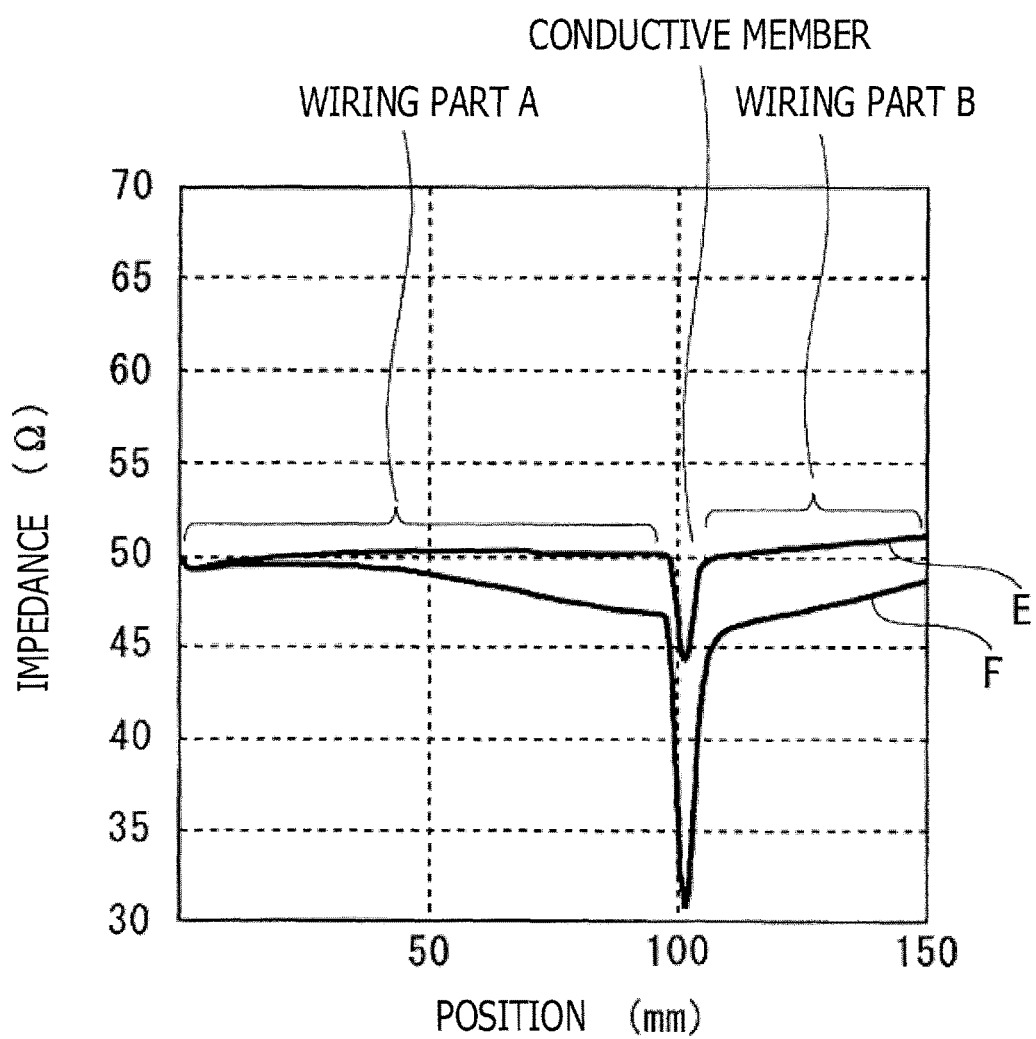
FIG. 7 is a graph illustrating a characteristic impedance of the conductive member of the package substrate according to the first embodiment and a characteristic impedance of the conductive member of the package substrate according to the comparative example.

FIGS. 5 and 6 are graphs illustrating a transfer characteristic of the conductive member 17 of the package substrate 2 according to the first embodiment, and a transfer characteristic of a conductive member 17 of a package substrate 6 according to a comparative example. FIG. 7 is a graph illustrating a characteristic impedance of the conductive member 17 of the package substrate 2 according to the first embodiment, and a characteristic impedance of the conductive member 17 of the package substrate 6 according to the comparative example.

Figure 8:
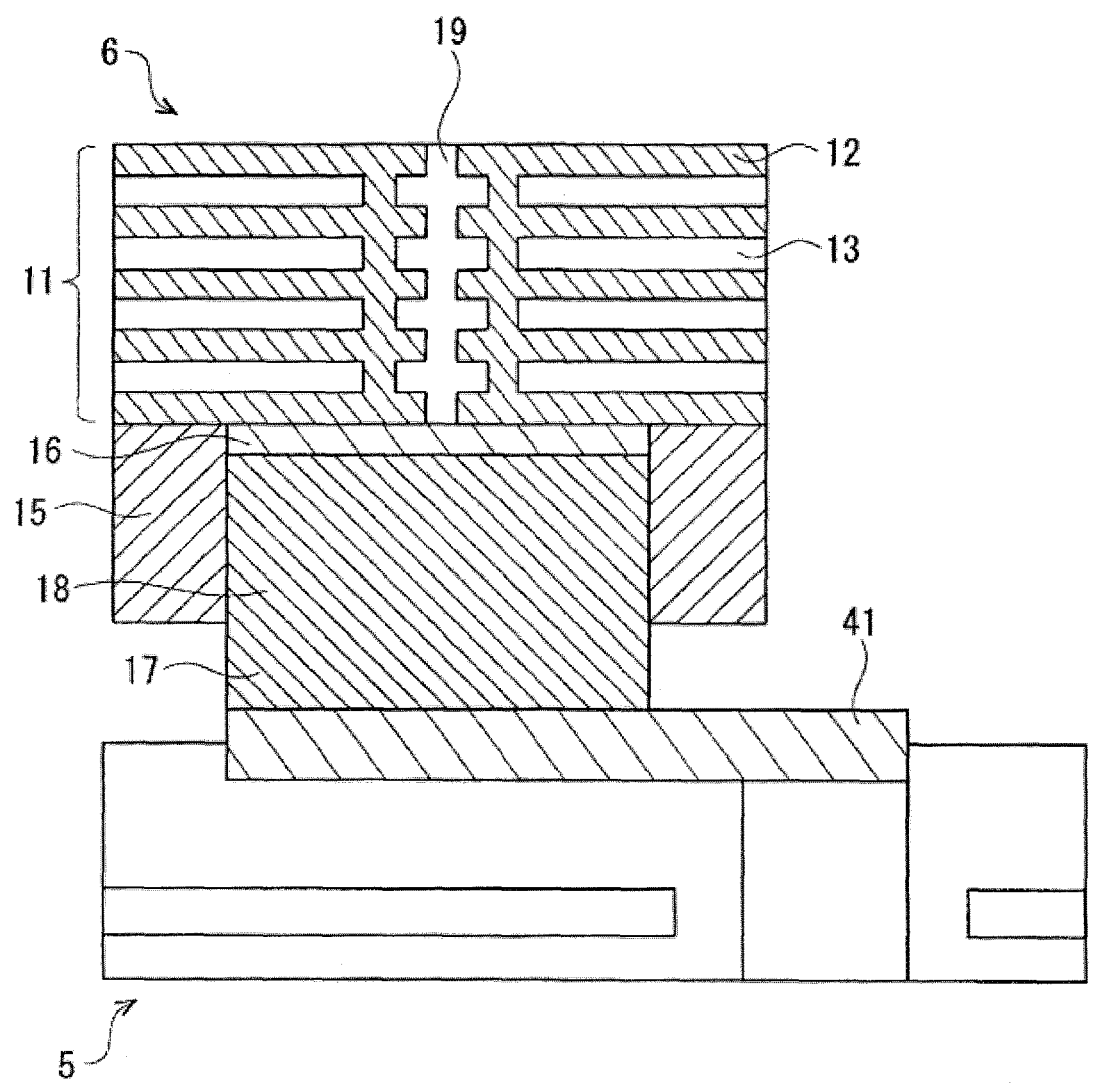
FIG. 8 is a partially enlarged cross-sectional view of the package substrate according to the comparative example.

FIG. 8 is a partially enlarged cross-sectional view of the package substrate 6 according to the comparative example. As illustrated in FIG. 8, in the package substrate 6 according to the comparative example, the shape of the through hole 18 of the insulation member 15 is a cylindrical shape, and the shape of the conductive member 17 is also a cylindrical shape. That is, in the package substrate 6 according to the comparative example, the conductive member 17 is not widened in a direction from the package substrate 6 toward the system board 5.

The conductive member 17 of the package substrate 2 according to the first embodiment having the characteristics as illustrated in the graphs of FIGS. 5 to 7 has a truncated cone shape, and the conductive member 17 of the package substrate 6 according to the comparative example having the characteristics as illustrated in the graphs of FIGS. 5 to 7 has a cylindrical shape. In the package substrate 2 according to the first embodiment as illustrated in FIGS. 5 to 7, the first opening of the through hole 18 of the insulation member 15 has a diameter of 0.3 mm, and the second opening of the through hole 18 of the insulation member 15 has a diameter of 0.6 mm. In the package substrate 6 according to the comparative example as illustrated in FIGS. 5 to 7, the first opening of the through hole 18 of the insulation member 15 has a diameter of 0.6 mm, and the second opening of the through hole 18 of the insulation member 15 has a diameter of 0.6 mm.

The transverse axis of FIG. 5 indicates the applied frequency (GHz). The vertical axis of FIG. 5 indicates the reflection coefficient S11 (dB) of the signal input to the conductive member 17 of the package substrate 2 according to the first embodiment as well as the reflection coefficient S11 (dB) of the signal input to the conductive member 17 of the package substrate 6 according to the comparative example.

The solid line A of FIG. 5 represents the change of the reflection coefficient S11 of the signal input to the conductive member 17 of the package substrate 2 according to the first embodiment. The higher the numerical value of the vertical axis of FIG. 5, the more the reflection coefficient of the signal input to the conductive member 17 of the package substrate 2 according to the first embodiment.

The solid line B of FIG. 5 represents the change of the reflection coefficient S11 of the signal input to the conductive member 17 of the package substrate 6 according to the comparative example. The higher the numerical value of the vertical axis of FIG. 5, the more the reflection coefficient of the signal input to the conductive member 17 of the package substrate 6 according to the comparative example.

As illustrated in FIG. 5, the reflection coefficient S11 (dB) of the signal input to the conductive member 17 of the package substrate 2 according to the first embodiment (curve A) is less than the reflection coefficient S11 (dB) of the signal input to the conductive member 17 of the package substrate 6 according to the comparative example (curve B). Therefore, according to the first embodiment, the reflection of the signal input to the conductive member 17 of the package substrate 2 is suppressed.

The transverse axis of FIG. 6 indicates the applied frequency (GHz). The vertical axis of FIG. 6 indicates the transmission coefficient S21 (dB) of the signal input to the conductive member 17 of the package substrate 2 according to the first embodiment as well as the transmission coefficient S21 (dB) of the signal input to the conductive member 17 of the package substrate 6 according to the comparative example.

The solid line C of FIG. 6 represents the change of the transmission coefficient S21 of the signal input to the conductive member 17 of the package substrate 2 according to the first embodiment. The higher the numerical value of the vertical axis of FIG. 6, the more the signal input to the conductive member 17 of the package substrate 2 according to the first embodiment transmits.

The solid line D of FIG. 6 represents the change of the transmission coefficient S21 of the signal input to the conductive member 17 of the package substrate 6 according to the comparative example. The higher the numerical value of the vertical axis of FIG. 6, the more the signal input to the conductive member 17 of the package substrate 6 according to the comparative example transmits.

As illustrated in FIG. 6, the transmission coefficient S21 (dB) of the signal input to the conductive member 17 of the package substrate 2 according to the first embodiment (curve C) is larger than the transmission coefficient S21 (dB) of the signal input to the conductive member 17 of the package substrate 6 according to the comparative example (curve D). Therefore, according to the first embodiment, the transmission of the signal input to the conductive member 17 of the package substrate 2 is improved.

The solid line E of FIG. 7 represents the change of the characteristic impedance in a wiring part B and the conductive member 17 of the package substrate 2 as well as in a wiring part A of the system board 5 according to the first embodiment. The solid line F of FIG. 7 represents the change of the characteristic impedance in a wiring part B and the conductive member 17 of the package substrate 6 as well as in a wiring part A of the system board 5 according to the comparative example. The transverse axis of FIG. 7 indicates the respective positions of the wiring part B and the conductive member 17 of the package substrate 2 as well as the wiring part A of the system board 5 according to the first embodiment. The transverse axis of FIG. 7 also indicates the respective positions of the wiring part B and the conductive member 17 of the package substrate 6 as well as the wiring part A of the system board 5 according to the comparative example. The wiring part B of the package substrate 2 includes the electrode pad 16 and the conductor pattern 19. The wiring part B of the package substrate 6 includes the electrode pad 16 and the conductor pattern 19. The wiring part A of the system board 5 includes the electrode pad 41 and the conductor pattern 42. The vertical axis of FIG. 7 indicates the characteristic impedance Ω.

As illustrated in FIG. 7, the characteristic impedance of the conductive member 17 of the package substrate 2 according to the first embodiment is closer to 50Ω than the characteristic impedance of the conductive member 17 of the package substrate 6 according to the comparative example. As illustrated in FIG. 7, according to the first embodiment, a rapid change of the characteristic impedance is suppressed in the conductive member 17 of the bonding portion between the package substrate 2 and the system board 5.

Figure 9:
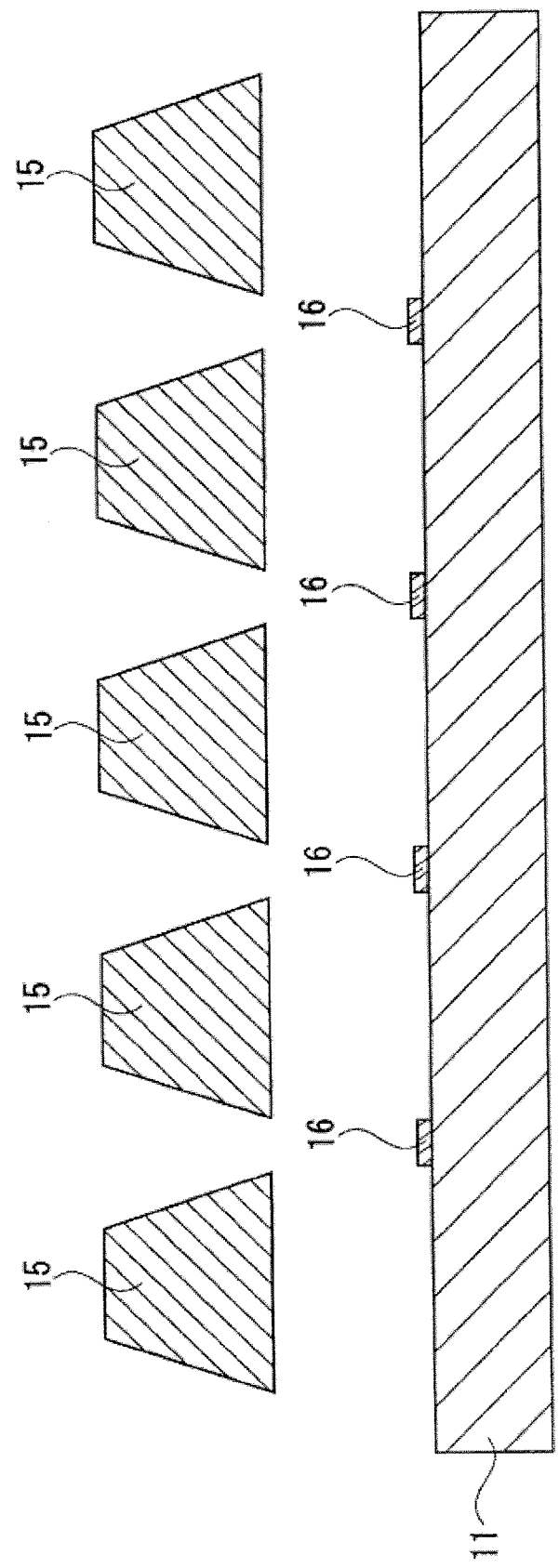
FIG. 9 is a partial cross-sectional view of a support substrate and an insulation member in a case where the insulation member is disposed above the support substrate.

A method for manufacturing the electronic device and the semiconductor package 1 according to the first embodiment will be described with reference to FIGS. 9 to 15. First, the insulation members 15 are formed in a mold on which convex portions each having a truncated pyramid shape or a truncated cone shape are arranged using an injection molding. After the insulation members 15 are removed from the mold, as illustrated in FIG. 9, the insulation members 15 are disposed above the support substrate 11 in a state where the bottom surface of each of the insulation members 15 faces toward the bottom surface of the support substrate 11. A semiconductor chip 3 may or may not be mounted on the top surface of the support substrate 11. FIG. 9 is a cross-sectional view of the support substrate 11 and the insulation member 15 when the insulation member 15 is disposed above the support substrate 11.

Figure 10:
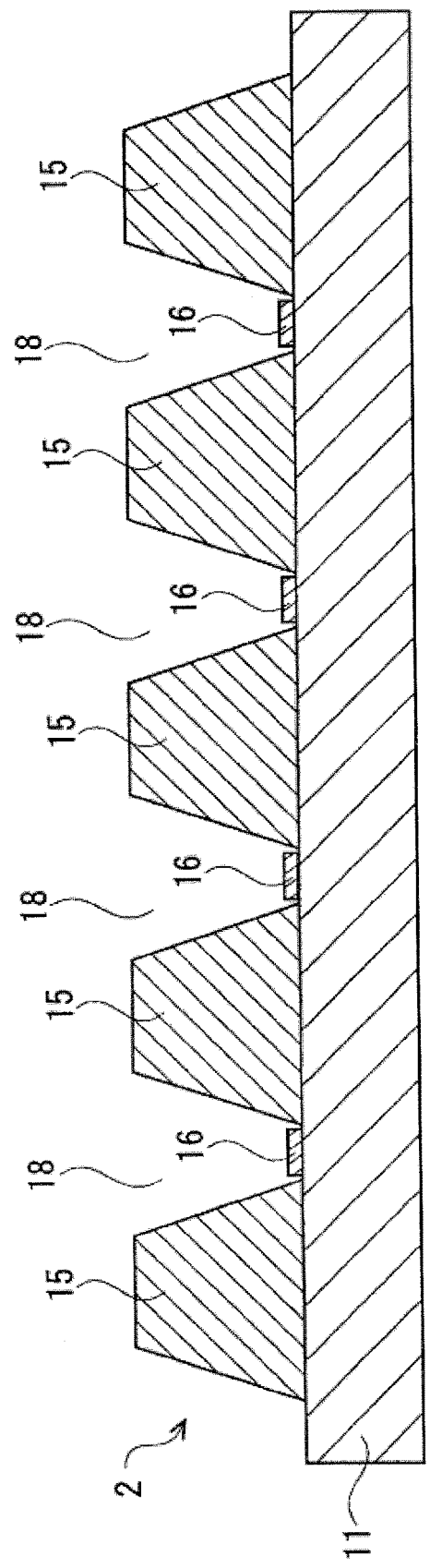
FIG. 10 is a cross-sectional view of the package substrate in a case where the insulation member is attached to the bottom surface of the support substrate.

Subsequently, as illustrated in FIG. 10, in a state where the bottom surface of the insulation member 15 faces toward the bottom surface of the support substrate 11, the electrode pad 16 of the package substrate 2 is accommodated within the through hole 18 of the insulation member 15 to attach the insulation member 15 to the bottom surface of the support substrate 11. For example, a bonding agent (product name: 5E1714) manufactured by Dow Corning Toray Co., Ltd., is applied to the peripheral portion of the bottom surface of the insulation member 15, and cured at about 150° C. for 30 minutes, thereby attaching the insulation member 15 to the bottom surface of the support substrate 11.

Figure 11:
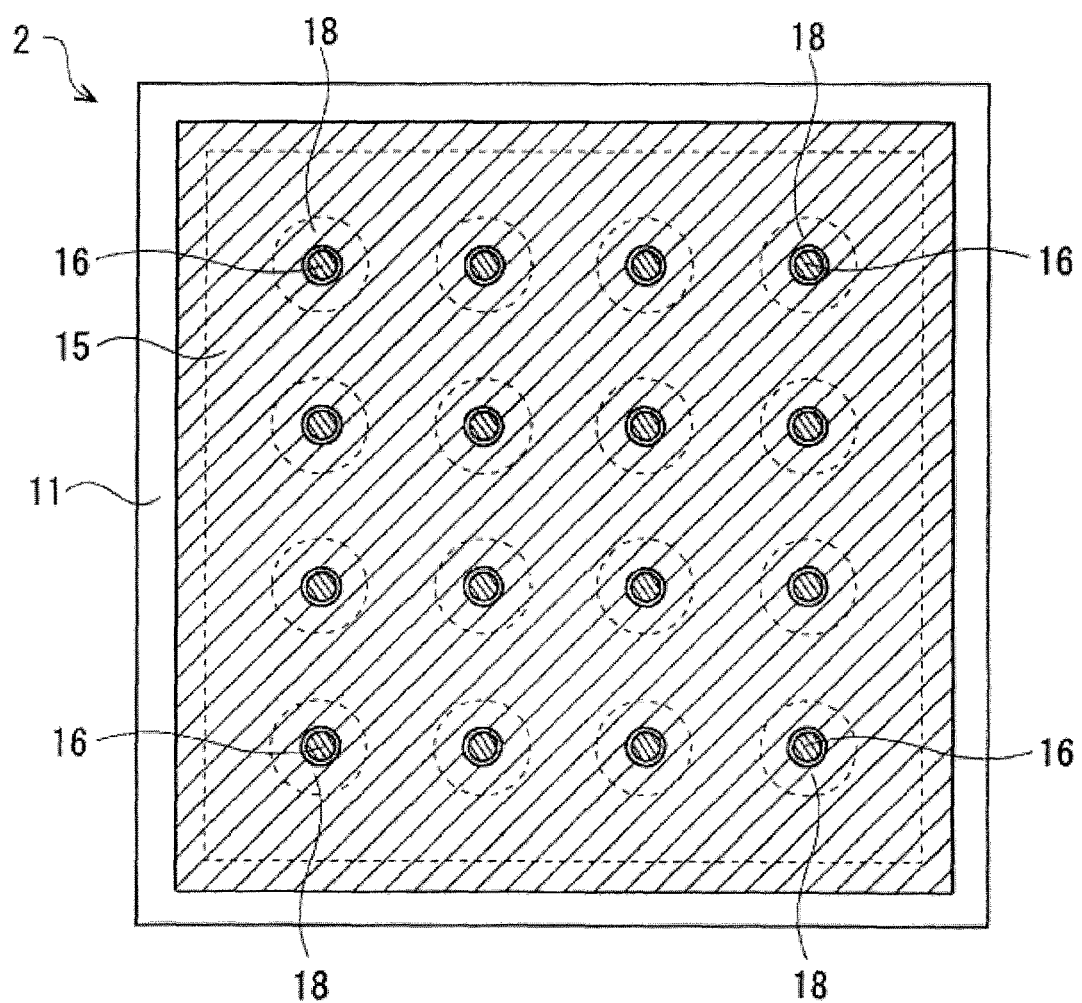
FIG. 11 is a plan view of the package substrate in a case where the insulation member is attached to the bottom surface of the support substrate.

FIG. 10 is a cross-sectional view of the package substrate 2 when the insulation member 15 is attached to the bottom surface of the support substrate 11. FIG. 11 is a plan view of the package substrate 2 when the insulation member 15 is attached to the bottom surface of the support substrate 11.

When there is no other conductor than the electrode pad 16 formed between the electrode pads 16 on the bottom surface of the support substrate 11, the electrode pad 16 may be inserted into the through hole 18 of the corresponding insulation member 15 to align the position of the support substrate 11 and the insulation member 15. That is, when the electrode pad 16 formed on the bottom surface of the support substrate 11 and the corresponding through hole 18 of the insulation member 15 are fitted with each other, the position of the support substrate 11 and the position of the insulation member 15 may be aligned. Accordingly, the position of the support substrate 11 and the position of the insulation member 15 may be aligned easily.

Figure 12:
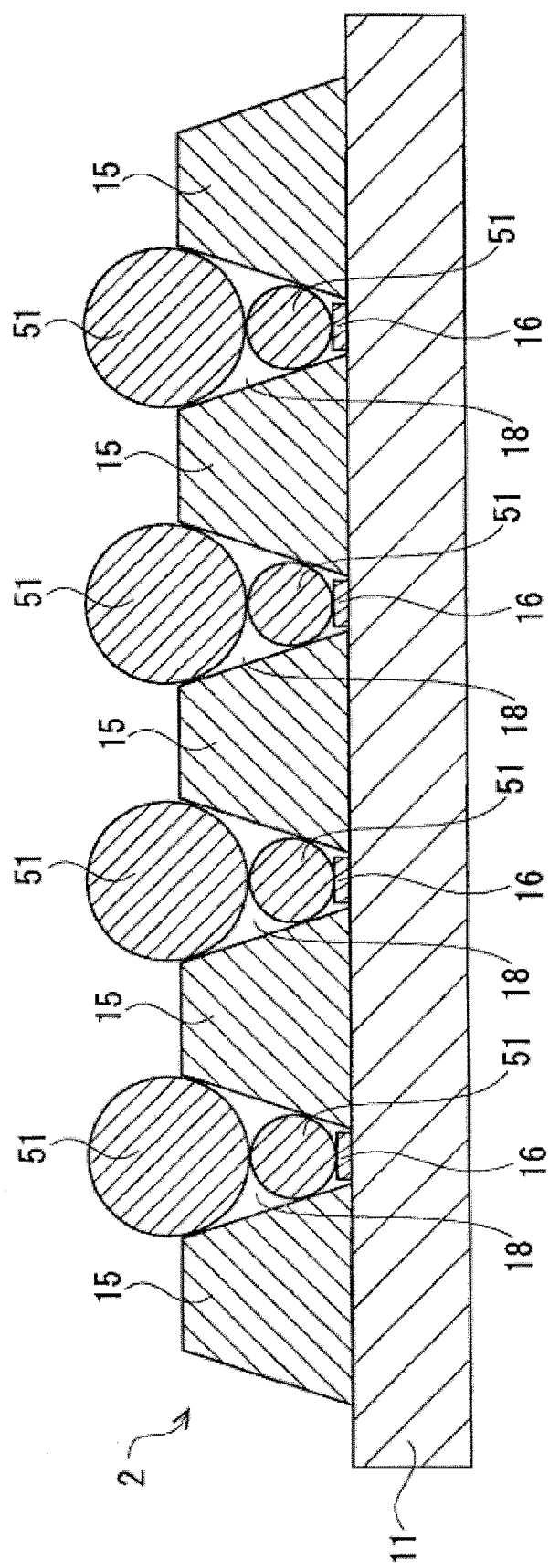
FIG. 12 is a cross-sectional view of the package substrate in a case where a solder ball is disposed within the through hole of the insulation member.

Subsequently, as illustrated in FIG. 12, solder balls 51 are disposed within the through holes 18 of the insulation member 15. FIG. 12 is a cross-sectional view of the package substrate 2 illustrating a case where the solder balls 51 are disposed within the through holes 18 of the insulation member 15. For example, a plurality of solder balls 51 may be disposed within the through hole 18 of the insulation member 15. The plurality of solder balls 51 may have different sizes from each other. Instead of disposing the plurality of solder balls 51 within the through holes 18 of the insulation members 15, a solder paste may be filled within the through holes 18 of the insulation members 15.

Figure 13:
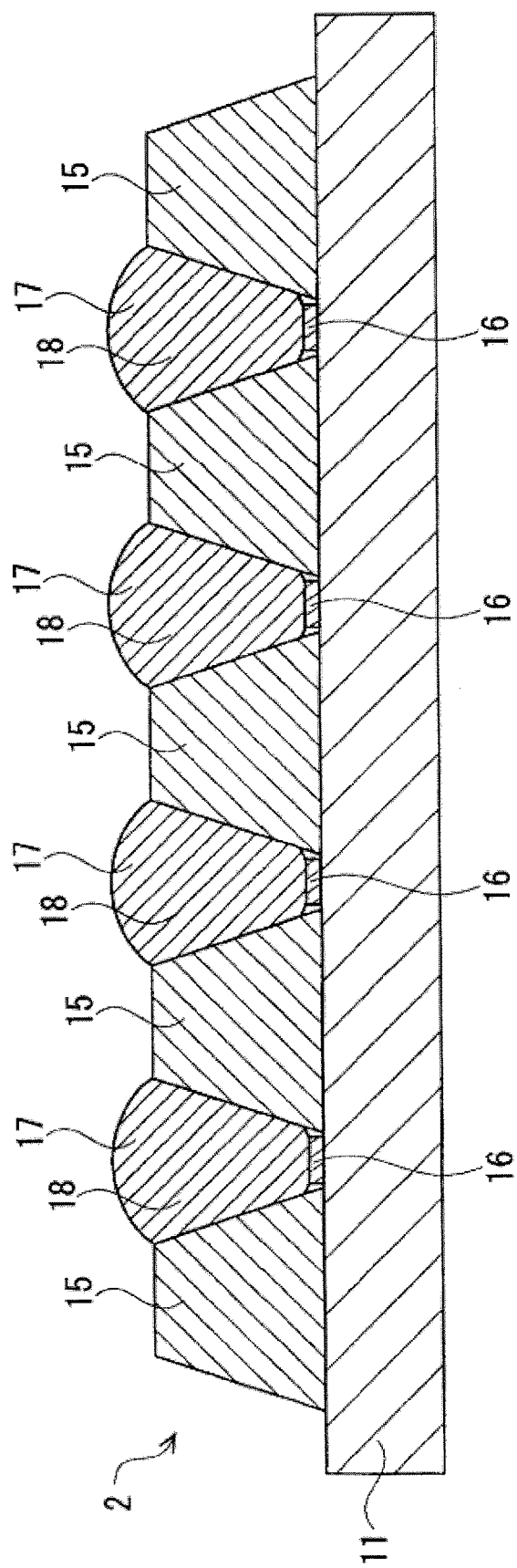
FIG. 13 is a cross-sectional view of the package substrate in a case where a conductive member is disposed within the through hole of the insulation member.

Subsequently, the package substrate 2 is transported into a heating furnace and a heat treatment is performed (a reflow processing). By performing the heat treatment, the solder balls 51 are molten, and as illustrated in FIG. 13, the conductive members 17 are formed within the through holes 18 of the insulation member 15, and thus, the electrode pads 16 of the support substrate 11 and the conductive members 17 are bonded to each other. FIG. 13 is a cross-sectional view of the package substrate 2 when the conductive members 17 are formed within the through holes 18 of the insulation members 15. After the conductive members 17 are formed within the through holes 18 of the insulation member 15, the semiconductor chip 3 may be mounted on the top surface of the support substrate 11.

Figure 14:
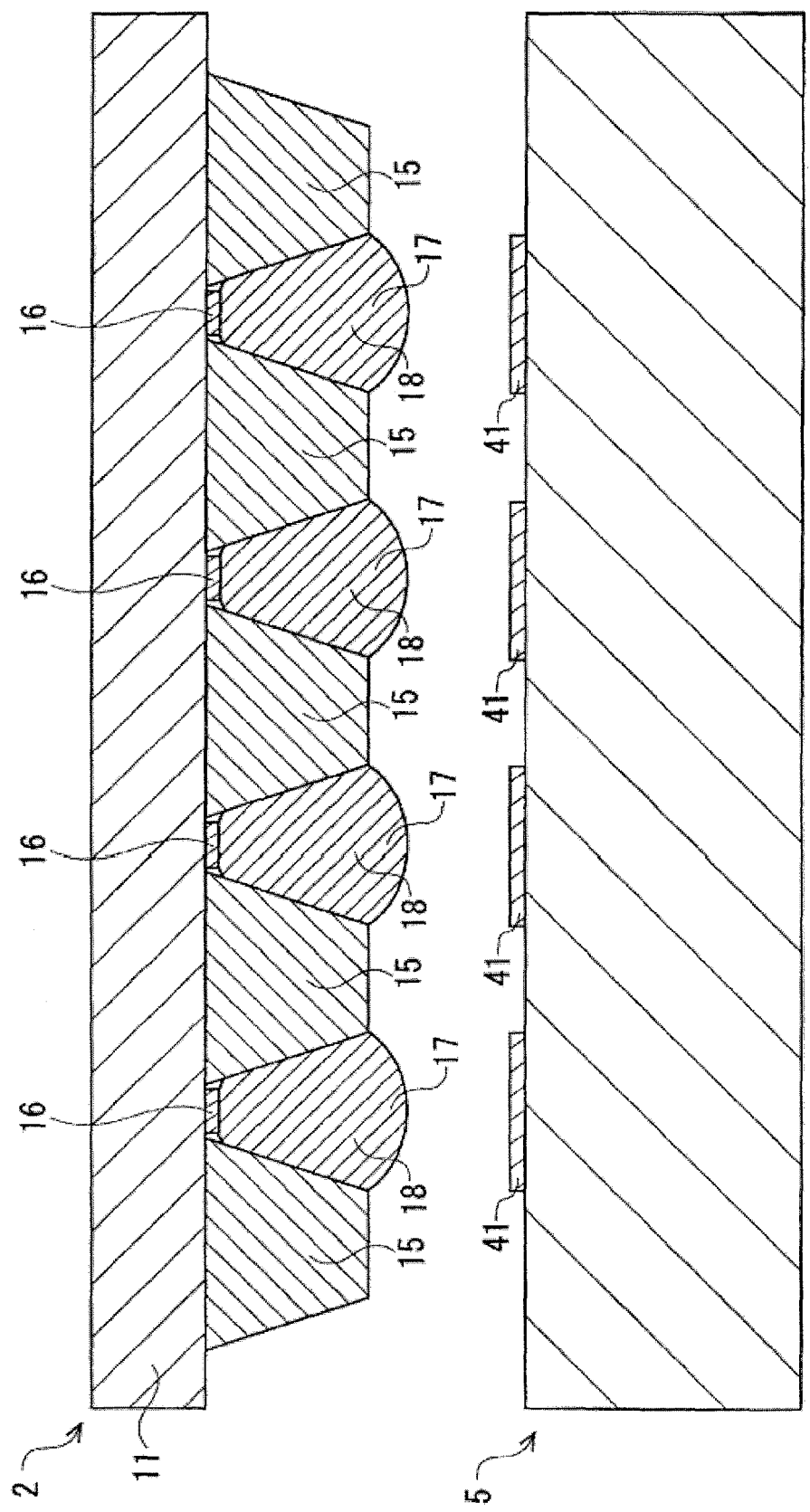
FIG. 14 is a cross-sectional view of a package substrate and a system board in a case where the package substrate is disposed above the system board.

Subsequently, as illustrated in FIG. 14, the package substrate 2 is disposed above the system board 5 in a state where the bottom surface of the support substrate 11 faces toward the top surface of the system board 5. In that case, the position of the package substrate 2 and the position of the system board 5 are aligned in such a manner that the conductive members 17 formed on the bottom surface of the support substrate 11 are located above the electrode pads 41 of the system board 5. FIG. 14 is a cross-sectional view of the package substrate 2 and the system board 5 when the package substrate 2 is disposed above the system board 5.

Figure 15:
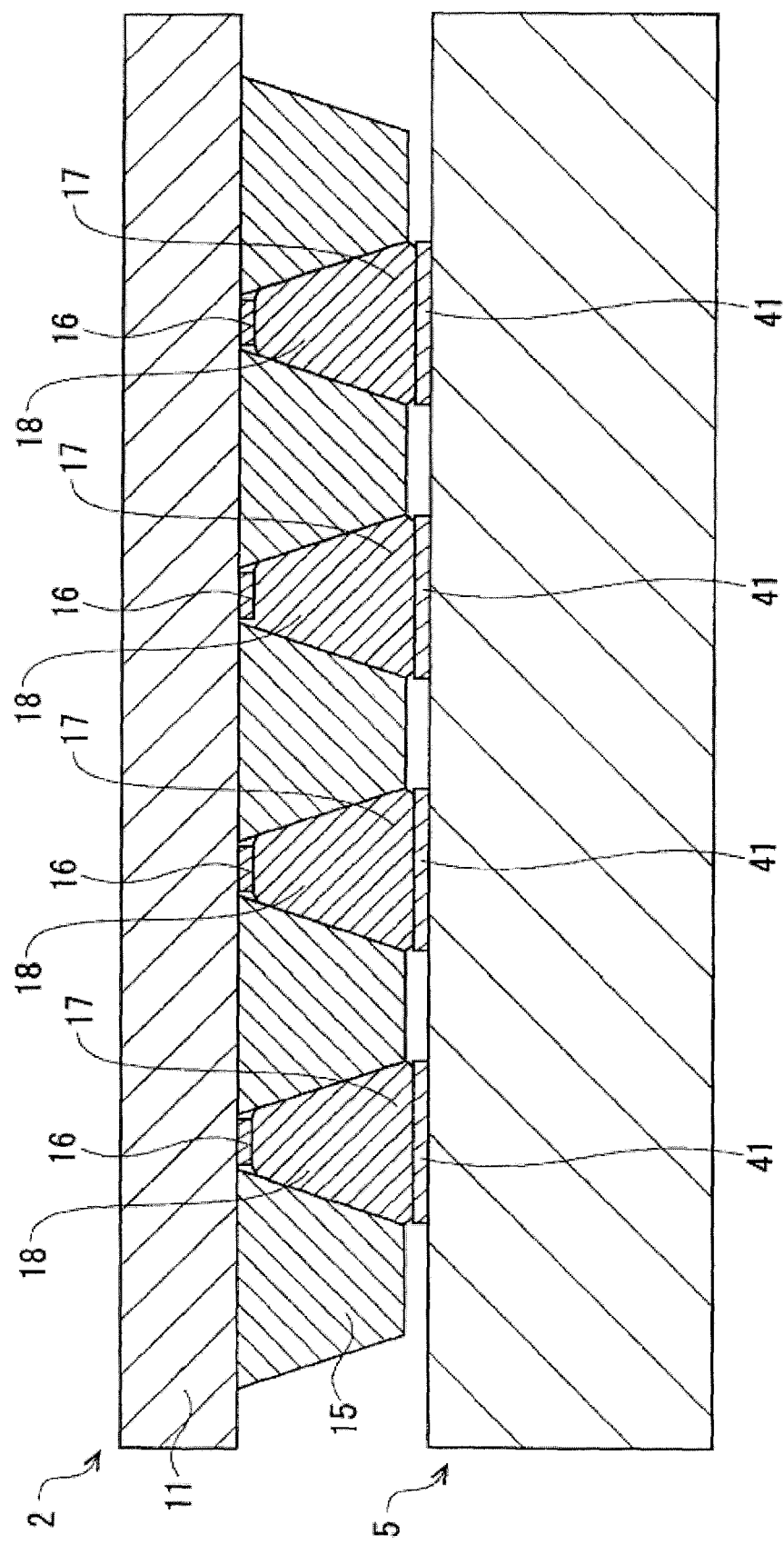
FIG. 15 is a cross-sectional view of the package substrate and the system board in a case where the package substrate is mounted on the system board.

Subsequently, the conductive members 17 formed on the bottom surface of the support substrate 11 and the electrode pads of the system board 5 are contacted with each other, and then the package substrate 2 and the system board 5 are transported into the heating furnace to perform a heat treatment (a reflow processing). By performing the heat treatment, as illustrated in FIG. 15, the conductive members 17 formed on the bottom surface of the support substrate 11 and the electrode pads 41 of the system board 5 are bonded to each other, and the package substrate 2 is mounted on the system board 5. FIG. 15 is a cross-sectional view of the package substrate 2 and the system board 5 when the package substrate 2 is mounted on the system board 5.

Each conductive member 17 has a shape that is widened toward the direction away from the support substrate 11.

Further, the surface area of each conductive member 17 in the bonding surface of the conductive member 17 and the corresponding electrode pad 16 of the package substrate 2 is smaller than the surface area of each conductive member 17 in the bonding surface of the conductive member 17 and the corresponding electrode pad 41 of the system board 5. As a result, the change of the characteristic impedance in the conductive members 17 bonded to the electrode pads 41 of the system board 5 and the electrode pads 16 of the package substrate 2 may be suppressed. Further, as described above with reference FIG. 7, even when the high frequency signal is used, the change of the characteristic impedance in the conductive members 17 bonded to the electrode pads 41 of the system board 5 and the electrode pads 16 of the package substrate 2 may be suppressed.

By setting the height of the insulation member 15 to a predetermined value, it is possible to set the height of the conductive members 17 to a predetermined value. Therefore, even if a deformation such as, for example, a flexure and a wrinkling occurs in the package substrate 2 and the system board 5, a state in which the conductive members 17 are not bonded to the electrode pads 16 of the package substrate 2 or the electrodes pad 41 of the system board 5 may be suppressed.

Second Embodiment

A second embodiment will be described. Further, the same components as in the first embodiment will be denoted by the same reference numerals and the description thereof will be omitted.

Figure 16:
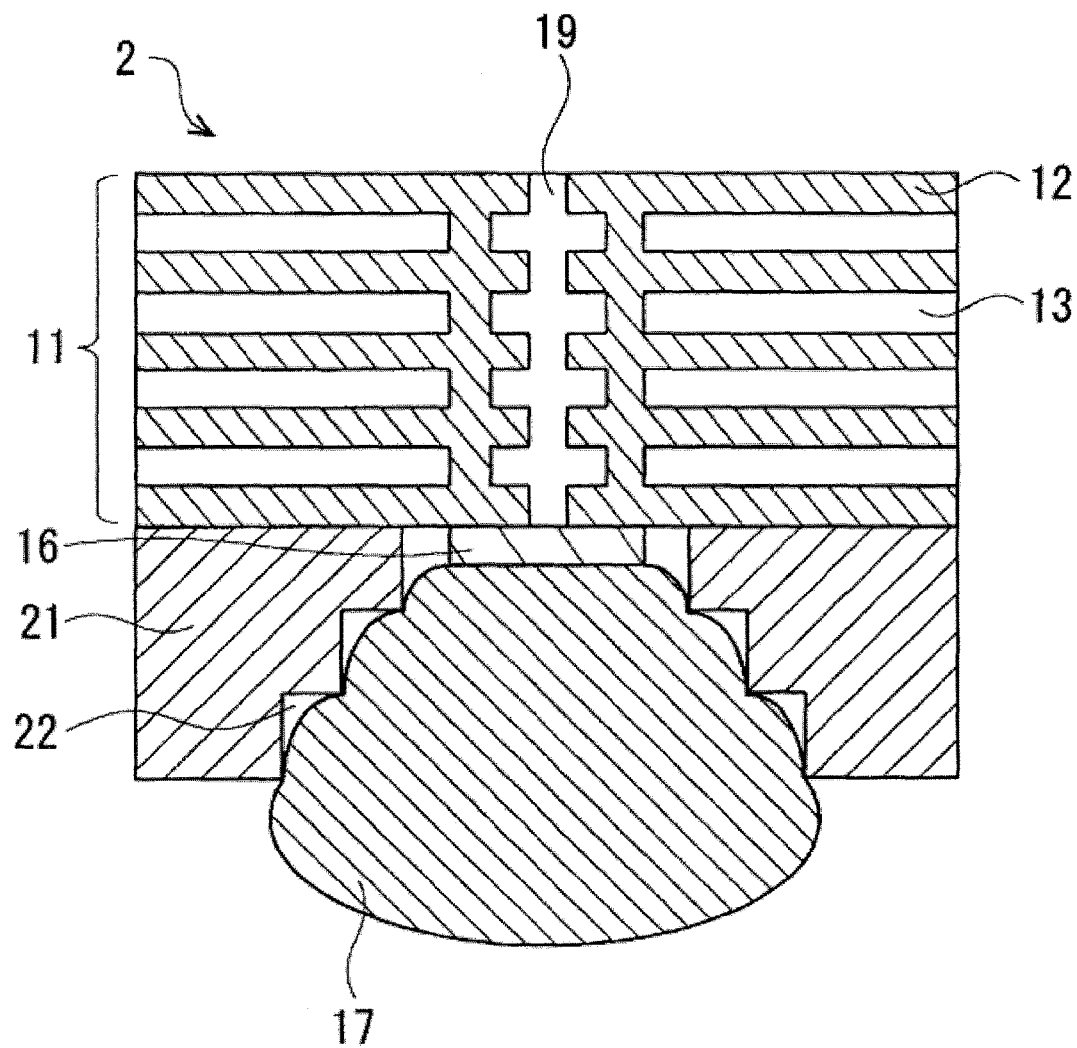
FIG. 16 is a partially enlarged cross-sectional view of a package substrate according to a second embodiment of the present disclosure.

FIG. 16 is a partially enlarged cross-sectional view of a package substrate 2 according to the second embodiment. An electrode pad 16, a conductive member 17, and an insulation member 21 are formed in the bottom surface (the surface opposite to the element mounting surface) of a support substrate 11. The insulation member 21 is an illustrative example of an insulation part. The insulation member 21 is formed by stacking a plurality of solder resist sheets. The thickness of the insulation member 21 is, for example, about a few hundred μm.

The insulation member 21 has a plurality of through holes 22 which transmit through the insulation member 21. Each of the through holes 22 of the insulation member 21 has a shape that is widened toward the direction away from the support substrate 11.

The first (one side) opening of the through hole 22 of the insulation member 21 is provided in the bottom surface of the insulation member 21, and the second (the other side) opening of the through hole 22 of the insulation member 21 is provided in the top surface of the insulation member 21. The bottom surface of the insulation member 21 is in contact with the bottom surface of the support substrate 11. Accordingly, the first opening of the through hole 22 of the insulation member 21 is closed by the support substrate 11.

The horizontal cross-section of the through hole 22 of the insulation member 21 may be a circular shape, and the through hole 22 of the insulation member 21 may have a shape in which the diameters of circular shapes increases step by step from the first opening toward the second opening of the through holes 22 of the insulation member 21. The diameter of the first opening of the through hole 22 of the insulation member 21 is, for example, about 0.2 mm or more and 0.3 mm or less. The diameter of the second opening of the through hole 22 of the insulation member 21 is, for example, about 0.6 mm or more and 1.0 mm or less.

The horizontal cross-section of the through hole 22 of the insulation member 21 may be a rectangular shape, and the through hole 22 of the insulation member 21 may have a shape in which the widths of the side of the rectangular shape increases step by step from the first opening toward the second opening of the through holes 22 of the insulation member 21. The width of the side of the first opening of the through hole 22 of the insulation member 21 is, for example, about 0.2 mm or more and 0.3 mm or less. The width of the side of the second opening of the through hole 22 of the insulation member 21 is, for example, about 0.6 mm or more and 1.0 mm or less.

The conductive member 17 is provided within the through hole 22 of the insulation member 21, and is bonded to the electrode pad 16. The conductive member 17 covers the entire top surface of the electrode pad 16.

The conductive member 17 is configured to be widened toward a direction away from the support substrate 11. The first end (one side) of the conductive member 17 is bonded to the electrode pad 16, and the second end (the other side) of the conductive member 17 protrudes from the second opening of the through hole 22 of the insulation member 21.

The horizontal cross-section of the conductive member 17 may be a circular shape, and the conductive member 17 may have a shape in which the diameter of circular shape increases step by step from the first end toward the second end of the conductive member 17. The horizontal cross-section of the conductive member 17 may be a rectangular shape, and the conductive member 17 may have a shape in which the widths of the side of the rectangular shape increases step by step from the first end toward the second end of the conductive member 17.

Figure 17:
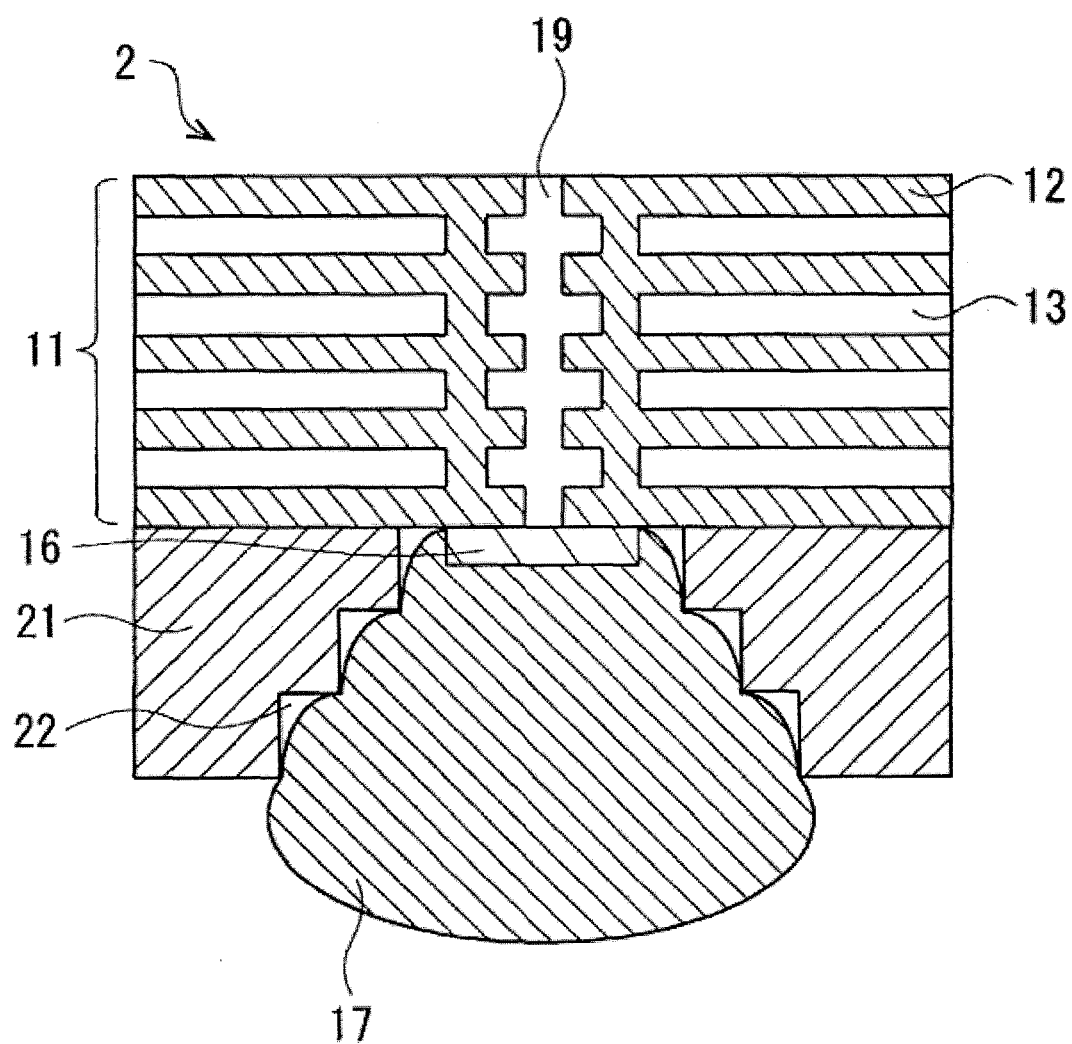
FIG. 17 is a partially enlarged cross-sectional view of the package substrate according to the second embodiment.

As illustrated in FIG. 17, the conductive member 17 may cover the entire top surface and the entire side surface of the electrode pad 16. FIG. 17 is a partially enlarged cross-sectional view of the package substrate 2 according to the second embodiment. The entire top surface and the entire side surface of the electrode pad 16 are covered by the conductive member 17, and thus, the bonding area between the electrode pad 16 and the conductive member 17 is increased to improve the bonding strength between the electrode pad 16 and the conductive member 17. Further, the conductive member 17 may cover the entire top surface and a part of the side surface of the electrode pad 16. Since the entire top surface and the part of the side surface of the electrode pad 16 are covered by the conductive member 17, the bonding area between the electrode pad 16 and the conductive member 17 is increased to improve the bonding strength between the electrode pad 16 and the conductive member 17. By making the size of the first opening of the through hole 22 of the insulation member 21 to be larger than that of the electrode pad 16, the side surface of the electrode pad 16 is easily covered by the conductive member 17.

Figure 18:
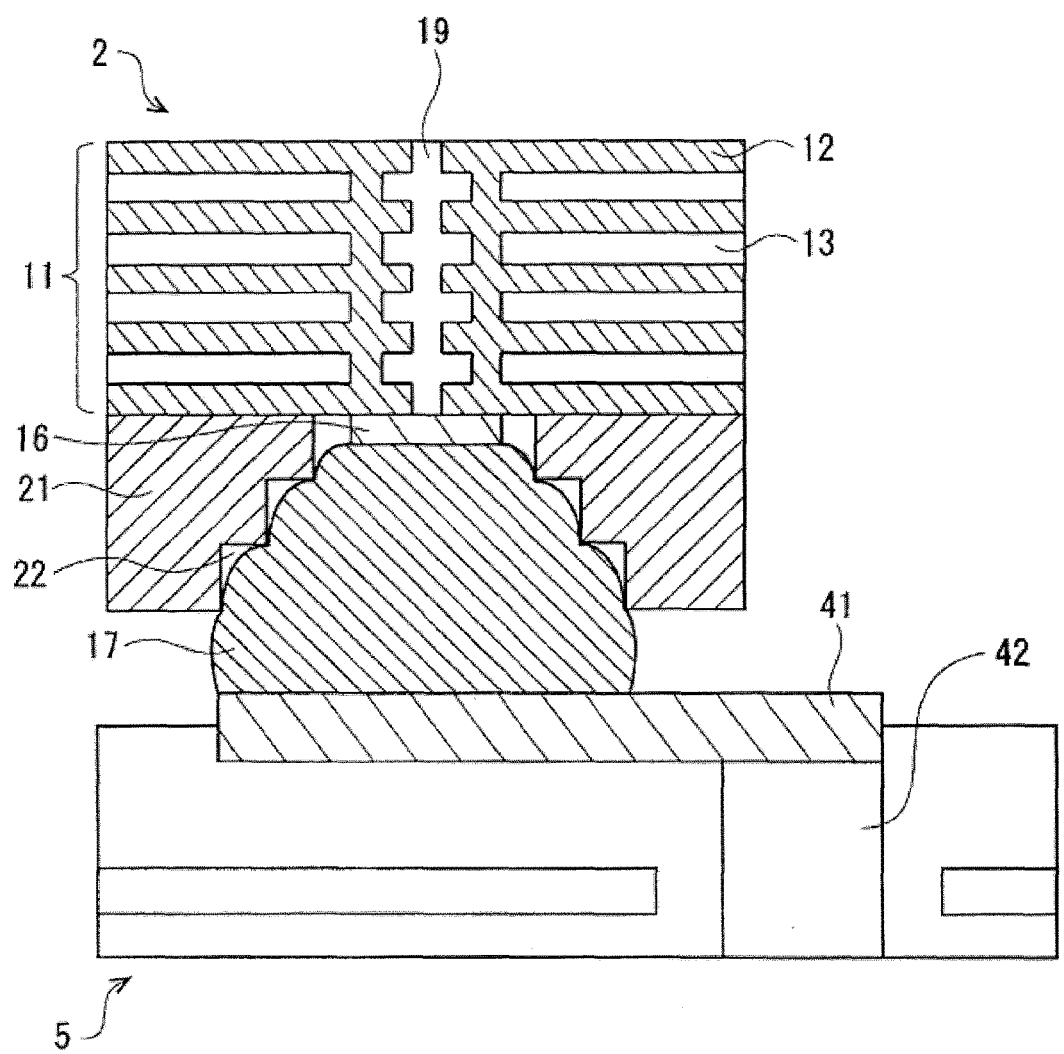
FIG. 18 is a partially enlarged cross-sectional view of an electronic device having a system board and a semiconductor package according to the second embodiment.
Figure 19:
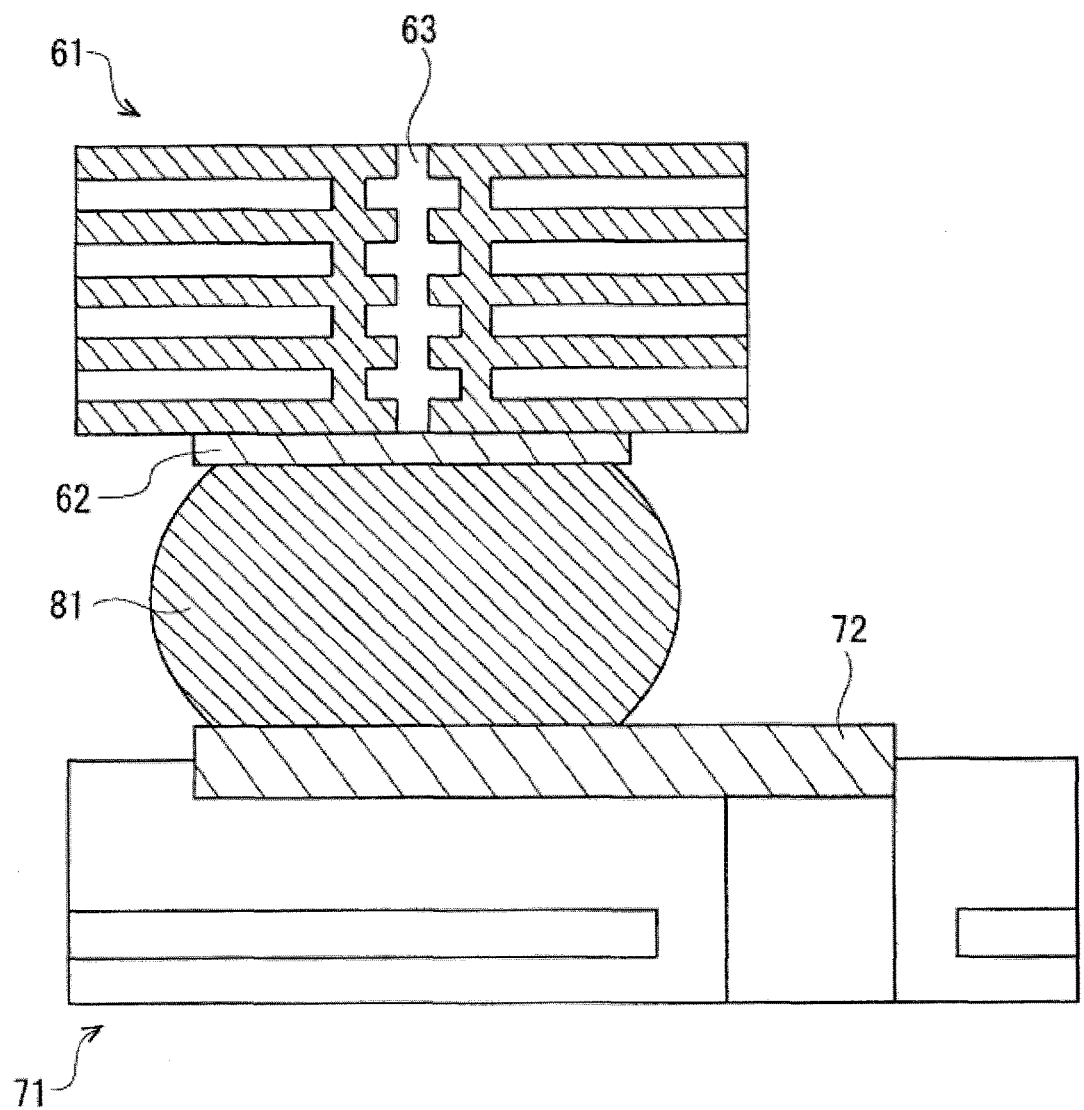
FIG. 19 is a cross-sectional view of a semiconductor package and a system board in a case where the semiconductor package is mounted on the system board.
Figure 20:
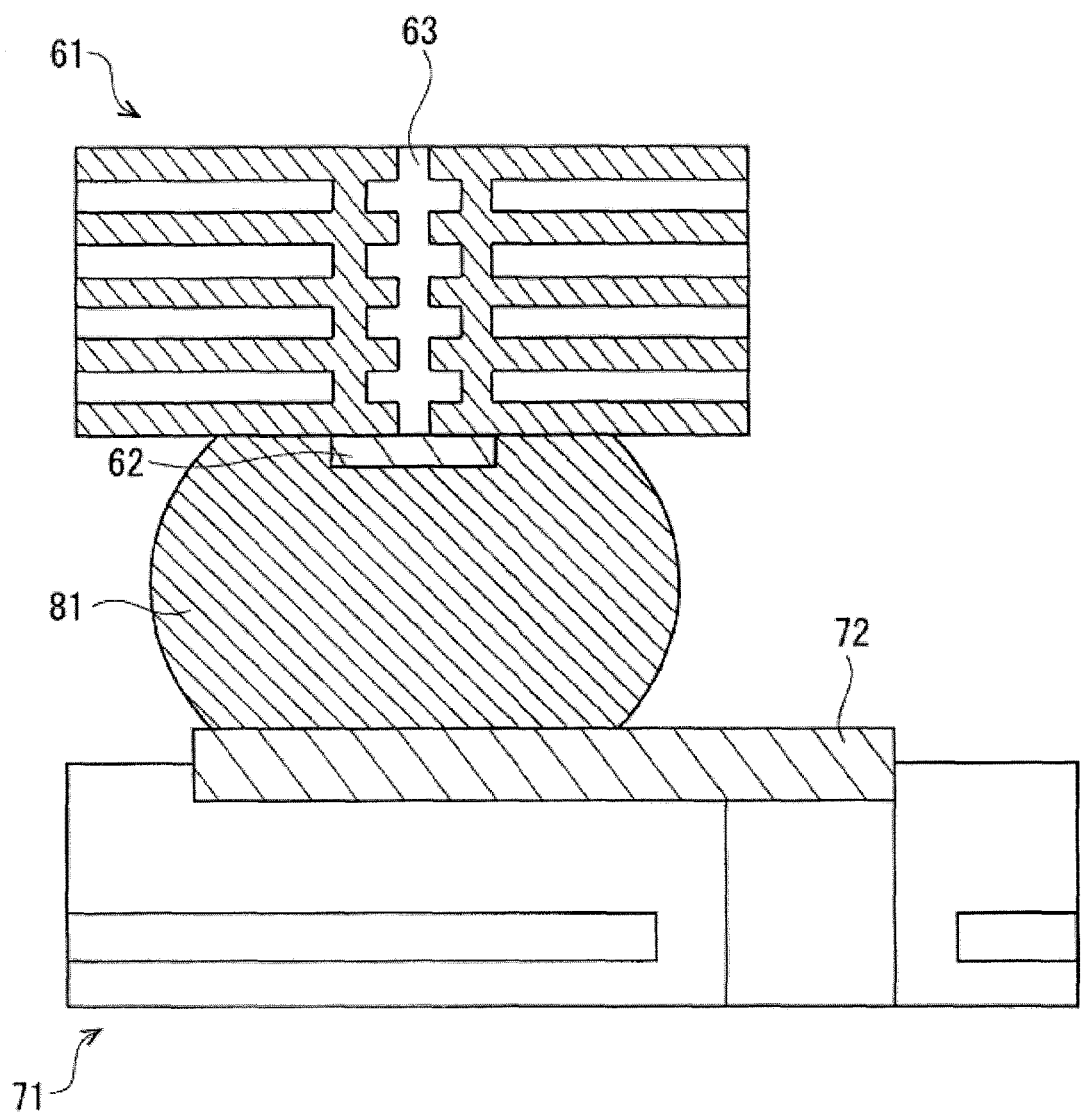
FIG. 20 is a cross-sectional view of the semiconductor package and the system board in a case where an electrode pad of the semiconductor package is minified.
Figure 21:
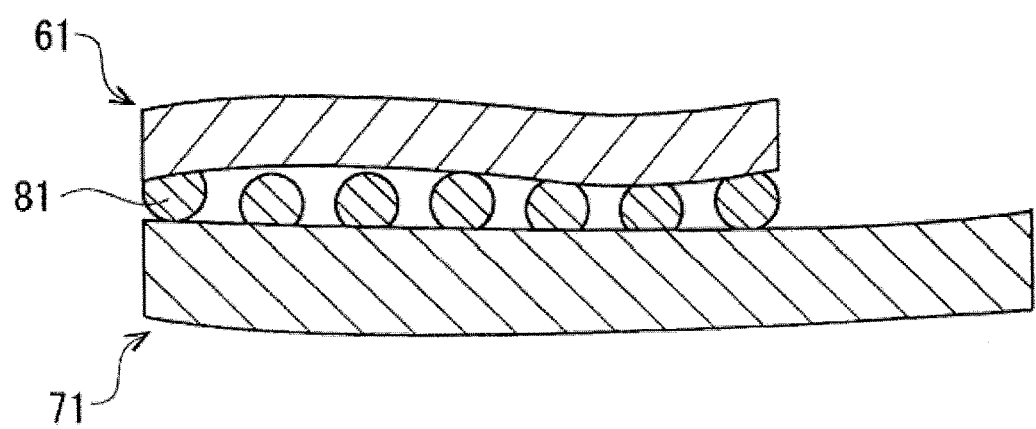
FIG. 21 is a cross-sectional view of the semiconductor package and the system board in a case where the semiconductor package and the system board are deformed.

FIG. 18 is a partially enlarged cross-sectional view of an electronic device having a system board (a wiring substrate) 5 and a semiconductor package 1 according to the second embodiment. The semiconductor package 1 (package substrate 2) is mounted on the top surface of the system board 5. The conductive member 17 is bonded to an electrode pad 41 of the system board 5. The electrode pad 16 of the package substrate 2 is smaller than the electrode pad 41 of the system board 5. The surface area of the conductive member 17 in the bonding surface of the conductive member 17 and the electrode pad 16 of the package substrate 2 is smaller than the surface area of the conductive member 17 in the bonding surface of the conductive member 17 and the electrode pad 41 of the system board 5. The electrode pad 41 of the system board 5 is electrically connected to a conductor pattern (wirings and vias) 42 of the system board 5. The semiconductor package 1 (package substrate 2) and the system board 5 are electrically connected to each other via the electrode pad 16 and the conductive member 17 of the package substrate 2 and the electrode pad 41 of the system board 5.

After forming the insulation member 21 by stacking a plurality of solder resist sheets, the semiconductor package 1 (package substrate 2) according to the second embodiment is manufactured using the similar processes (FIGS. 9 to 15) as in the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a wiring substrate comprising:
    arranging an insulator on a substrate so that an electrode of the substrate is accommodated within a through hole of the insulator;
    disposing a first solder ball in a bottom of the through hole;
    disposing a second solder ball, that is greater than the first solder ball, on the first solder ball, a part of the second solder ball sticks out from the through hole; and
    forming a conductor in the through hole by melting the first and second solder balls, the conductor and the electrode are bonded to each other,
    wherein the through hole is made to have a shape that is widened toward a direction away from the substrate, and
    the conductor is made to cover the entire top surface of the electrode and has a shape that is widened toward the direction away from the substrate.

2. The method according to claim 1, wherein the conductor is made to cover the entire side surface of the electrode or a part of the side surface of the electrode.

3. The method according to claim 1, wherein the electrode is provided with unevenness on a bonding surface of the electrode and the conductor.

4. The method according to claim 1, wherein the position of the substrate and the position of the insulator are aligned by fitting the electrode to the through hole.

5. A method of manufacturing an electronic device comprising:
    arranging an insulator on a first substrate so that a first electrode of the first substrate is accommodated within a through hole of the insulator;
    disposing a first solder ball in a bottom of the through hole;
    disposing a second solder ball, that is greater than the first solder ball, on the first solder ball, a part of the second solder ball sticks out from the through hole; and
    forming a conductor in the through hole by melting the first and second solder balls, the conductor and the electrode are bonded to each other, and bonding the conductor to a second electrode of a second substrate,
wherein the through hole is made to have a shape that is widened toward a direction away from the first substrate, and
the conductor is made to cover the entire top surface of the first electrode and has a shape that is widened toward the direction away from the first substrate.

6. The method according to claim 5, wherein the conductor is made to cover the entire side surface of the first electrode of the first substrate or a part of the side surface of the first electrode of the first substrate.

7. The method according to claim 5, wherein the first electrode of the first substrate is provided with unevenness on a bonding surface of the first electrode and the conductor.

8. The method according to claim 5, wherein the position of the first substrate and the position of the insulator are aligned by fitting the first electrode of the first substrate to the through hole.

* * * * *